(12) United States Patent
Presser et al.

(10) Patent No.: US 9,324,579 B2
(45) Date of Patent: Apr. 26, 2016

(54) METAL STRUCTURES AND METHODS OF USING SAME FOR TRANSPORTING OR GETTERING MATERIALS DISPOSED WITHIN SEMICONDUCTOR SUBSTRATES

(71) Applicant: The Aerospace Corporation, El Segundo, CA (US)

(72) Inventors: Nathan Presser, West Hollywood, CA (US); David P. Taylor, Hawthorne, CA (US)

(73) Assignee: The Aerospace Corporation, El Segundo, CA (US)

(*) Notice: Subject to any disclaimer, the term of this patent is extended or adjusted under 35 U.S.C. 154(b) by 122 days.

(21) Appl. No.: 13/830,856

(22) Filed: Mar. 14, 2013

(65) Prior Publication Data

US 2014/0264757 A1    Sep. 18, 2014

(51) Int. Cl.
*H01L 21/322* (2006.01)
*H01L 21/74* (2006.01)

(52) U.S. Cl.
CPC ............ *H01L 21/3221* (2013.01); *H01L 21/74* (2013.01)

(58) Field of Classification Search
CPC .................................................. H01L 21/3221
USPC ........................................................ 438/476
See application file for complete search history.

(56) References Cited

U.S. PATENT DOCUMENTS

| | | | |
|---|---|---|---|
| 3,976,511 A | 8/1976 | Johnson et al. | |
| 4,517,226 A | 5/1985 | Baldi et al. | |
| 4,677,740 A | 7/1987 | Shifrin et al. | |
| 4,757,369 A | 7/1988 | Jackson et al. | |
| 4,993,034 A | 2/1991 | Aoki et al. | |
| 5,133,757 A | 7/1992 | Sioshansi et al. | |
| 5,725,573 A | 3/1998 | Dearnaley et al. | |
| 5,822,347 A | 10/1998 | Yokogawa et al. | |
| 5,953,603 A | 9/1999 | Kim | |
| 6,252,294 B1 * | 6/2001 | Hattori et al. | 257/620 |
| 6,274,460 B1 * | 8/2001 | Delgado et al. | 438/476 |
| 6,432,844 B1 | 8/2002 | Farrar | |
| 6,472,109 B2 | 10/2002 | Rolfson | |

(Continued)

FOREIGN PATENT DOCUMENTS

| | | |
|---|---|---|
| CN | 1123340 A | 5/1996 |
| CN | 1348018 A | 5/2002 |

(Continued)

OTHER PUBLICATIONS

U.S. Appl. No. 14/086,826, filed Nov. 21, 2013, Abraham et al.

(Continued)

*Primary Examiner* — Daniel Luke
(74) *Attorney, Agent, or Firm* — Jones Day; Jaime D. Choi

(57) ABSTRACT

Embodiments of the present invention provide metal structures for transporting or gettering materials disposed on or within a semiconductor substrate. A structure for transporting a material disposed on or within a semiconductor substrate may include a metal structure disposed within the semiconductor substrate and at a spaced distance from the material. The metal structure is configured to transport the material through the semiconductor substrate and to concentrate the material at the metal structure. The material may include a contaminant disposed within the semiconductor substrate, e.g., that originates from electronic circuitry on the substrate.

20 Claims, 12 Drawing Sheets

(56) References Cited

U.S. PATENT DOCUMENTS

| | | |
|---|---|---|
| 6,590,271 B2 | 7/2003 | Liu et al. |
| 6,709,961 B2 | 3/2004 | Noda |
| 6,753,240 B2 | 6/2004 | Hayashida |
| 6,815,301 B2 | 11/2004 | Shindo |
| 6,833,313 B2 | 12/2004 | Hayakawa |
| 7,005,340 B2 | 2/2006 | Hayashi |
| 7,012,274 B2 | 3/2006 | Taylor |
| 7,056,816 B2 | 6/2006 | Shibata |
| 7,170,083 B2 | 1/2007 | Freeman et al. |
| 7,214,614 B2 | 5/2007 | Chopra et al. |
| 7,419,915 B2 | 9/2008 | Abraham et al. |
| 7,419,917 B2 | 9/2008 | Abraham |
| 7,510,786 B2 | 3/2009 | Veerasamy et al. |
| 7,544,398 B1 | 6/2009 | Chang et al. |
| 7,799,589 B2 | 9/2010 | Akiyama et al. |
| 7,861,575 B2 | 1/2011 | Jun et al. |
| 8,021,778 B2 | 9/2011 | Snyder et al. |
| 8,158,532 B2 | 4/2012 | Mayer et al. |
| 8,269,931 B2 | 9/2012 | Abraham et al. |
| 8,309,438 B2 | 11/2012 | Colombo et al. |
| 8,368,155 B2 | 2/2013 | Abraham et al. |
| 8,507,797 B2 | 8/2013 | Veerasamy |
| 8,625,064 B2 | 1/2014 | Abraham et al. |
| 9,048,179 B2 | 6/2015 | Abraham et al. |
| 2002/0182827 A1 | 12/2002 | Abe et al. |
| 2003/0082882 A1 | 5/2003 | Babcock et al. |
| 2003/0082892 A1 | 5/2003 | Fan et al. |
| 2003/0207044 A1* | 11/2003 | Sopori ............... 427/551 |
| 2004/0082149 A1 | 4/2004 | Sakaguchi et al. |
| 2004/0188725 A1 | 9/2004 | Fujiwara et al. |
| 2005/0186759 A1 | 8/2005 | So |
| 2005/0250289 A1 | 11/2005 | Babcock et al. |
| 2005/0250328 A1 | 11/2005 | Fujii |
| 2006/0078024 A1 | 4/2006 | Matsumura et al. |
| 2006/0115965 A1 | 6/2006 | Abraham |
| 2007/0020893 A1* | 1/2007 | Ueno et al. ............... 438/479 |
| 2007/0217458 A1 | 9/2007 | Kitano et al. |
| 2008/0073643 A1 | 3/2008 | Ryu et al. |
| 2008/0197362 A1 | 8/2008 | Hisamoto et al. |
| 2009/0020764 A1 | 1/2009 | Anderson et al. |
| 2009/0032831 A1 | 2/2009 | Akiyama et al. |
| 2009/0072243 A1 | 3/2009 | Suda et al. |
| 2009/0078974 A1 | 3/2009 | Nagai et al. |
| 2009/0151429 A1 | 6/2009 | Jun et al. |
| 2009/0242935 A1 | 10/2009 | Fitzgerald |
| 2009/0273034 A1 | 11/2009 | Woon et al. |
| 2010/0006855 A1* | 1/2010 | Park et al. ............... 257/72 |
| 2010/0323113 A1 | 12/2010 | Ramappa et al. |
| 2012/0003438 A1 | 1/2012 | Appleton et al. |
| 2012/0049200 A1 | 3/2012 | Abraham et al. |
| 2012/0083103 A1 | 4/2012 | Shifren et al. |
| 2012/0235281 A1 | 9/2012 | Abraham et al. |
| 2012/0301095 A1 | 11/2012 | Abraham et al. |
| 2012/0312693 A1 | 12/2012 | Veerasamy |
| 2014/0141604 A1 | 5/2014 | Abraham et al. |

FOREIGN PATENT DOCUMENTS

| | | |
|---|---|---|
| DE | 19730296 | 1/1999 |
| EA | 1402 | 2/2001 |
| EP | 0363944 A | 4/1990 |
| ES | 2138884 | 1/2000 |
| GB | 2422246 A | 7/2006 |
| JP | 61-006319 A | 1/1986 |
| JP | 1-042564 A | 2/1989 |
| JP | 1-283824 A | 11/1989 |
| JP | 1-283825 A | 11/1989 |
| JP | 2-270974 A | 11/1990 |
| JP | 3-229854 A | 10/1991 |
| JP | 4-042920 A | 2/1992 |
| JP | 4-290429 A | 10/1992 |
| JP | 5-205616 | 8/1993 |
| JP | 6-056481 A | 3/1994 |
| JP | 6-132259 A | 5/1994 |
| JP | 8-274268 A | 10/1996 |
| JP | 2000-093503 | 4/2000 |
| JP | 2004-315876 A | 11/2004 |
| JP | 2006-000219 A | 1/2006 |
| JP | 2008-022696 A | 1/2008 |
| KR | 2004-0022639 | 3/2004 |
| TW | 201029057 | * 8/2010 |
| WO | WO 98/26457 | 6/1998 |
| WO | WO 01/72104 A1 | 10/2001 |
| WO | WO 03/086496 A1 | 10/2003 |
| WO | WO 2005/043603 A2 | 5/2005 |

OTHER PUBLICATIONS

Belov et al., "Formation and 'White' Photoluminescence of Nanoclusters in SiOx Films Implanted with Carbon Ions," ISSN 1063-7826, Semiconductors, vol. 44, No. 11, pp. 1450-1456 (2010).

Borders et al., "Formation of SiC in Silicon by Ion Implantation," Applied Physics Letters, vol. 18, No. 11, pp. 509-511 (Jun. 1, 1971).

Chandrasekhar et al., "Strategies for the synthesis of highly concentrated Si1-yCy diamond-structured systems," Applied Physics Letters 72 (1998) 2117-2119.

Di et al., "Thermal stability of diamondlike carbon buried layer fabricated by plasma immersion ion implantation and deposition in silicon on insulator," Journal Applied Physics, 98:053502 (2005).

Di et al., "Fabrication of silicon-on-Si $O_2$/diamondlike-carbon dual insulator using ion cutting and mitigation of self-heating effects," Journal Applied Physics, 88:142108 (2006).

Friedland et al., "Dependence of critical damage energies in diamond on electronic stopping," Surface and Coatings Technology, vol. 158-159, pp. 64-68 (2002).

Harbsmeier et al., "Epitaxial regrowth of C- and N-implanted silicon and $\alpha$-quartz," Nuclear Instruments and Methods in Physics Research B, vol. 136-138, pp. 263-267 (1998).

Huang et al., "Growth of nearly one nanometer large silicon particles in silicon carbide and their quantum-confined photoluminescence features," Nanotechnology, vol. 18, 445605, pp. 1-5 (2007).

Jambois et al., "Field effect white and tunable electroluminescence from ion beam synthesized Si- and C-rich $SiO2$ layers," Applied Physics Letters, vol. 91, No. 21, pp. 211105-1 to 211105-3 (2007).

Jambois et al., "White electroluminescence from C- and Si-rich thin silicon oxides," Applied Physics Letters, vol. 89, No. 25, pp. 253124-1 to 253124-3 (2006).

Kantor et al., "Evolution of implanted carbon in silicon upon pulsed excimer laser annealing," Applied Physics Letters 69 (1996) 969-971.

Katharria et al., "Synthesis of buried SiC using an energetic ion beam," Journal of Physics D: Applied Physics 39 (2006) 3969-3973.

Krause et al., "Structure of silicon carbide precipitates in oxygen-implanted and annealed silicon-on-insulator material," Applied Physics Letters 53 (1988) 63-65.

Martin et al., "High-temperature ion beam synthesis of cubic SiC," J.Appl. Phys., vol. 67, No. 6, pp. 2908-2912 (1990).

Moore et al., "Laser micromachining of thin films for optoelectronic devices and packages," Laser Micromachining for Optoelectronic Device Fabrication, Proceedings of SPIE, vol. 4941, pp. 140-147 (2003).

Nguyen et al., "Spectroscopic ellipsometry studies of crystalline silicon implanted with carbon ions," Journal of Applied Physics 67 (1990) 3555-3559.

Pellegrino et al., "Time-resolved analysis of the white photoluminescence from $SiO2$ films after Si and C coimplantation," Applied Physics Letters, vol. 84, No. 1, pp. 25-27 (2004).

Perez-Rodriguez et al., "White luminescence from Si+ and C+ ion-implanted $SiO2$ films," Journal of Applied Physics, vol. 94, No. 1, pp. 254-262 (2003).

Serre et al., "β-SiC on $SiO_2$ formed by ion implantation and bonding for micromechanics applications," Sensors and Actuators, vol. 47, pp. 169-173 (1999).

Taylor et al., "Carbon precipitation in silicon: Why is it so difficult?" Applied Physics Letters 62 (1993) 3336-3338.

Terakado et al. "Modification of surface condition and irradiation effects of synchrotron radiation on photoexcited etching of SiC," J. Vac. Sci. Technol. A, vol. 13, No. 6, pp. 2715-2720 (1995).

(56) References Cited

OTHER PUBLICATIONS

Tetelbaum et al., "Effect of carbon implantation on visible luminescence and composition of Si-implanted SiO2 layers," Surface and Coatings Technology 203, pp. 2658-2663 (2009).

USPTO Notice of Allowance for U.S. Appl. No. 13/567,998, 15 pages (mailed Sep. 19, 2013).

USPTO Non-Final Office Action for U.S. Appl. No. 13/567,998, 12 pages, (mailed Jan. 15, 2013).

USPTO Notice of Allowance for U.S. Appl. No. 12/584,939, 8 pages (mailed May 9, 2012).

USPTO Office Action for U.S. Appl. No. 12/584,939, 10 pages (mailed Dec. 1, 2011).

USPTO Non-Final Office Action for U.S. Appl. No. 13/049,762, 11 pages (mailed Mar. 1, 2013).

USPTO Final Office Action for U.S. Appl. No. 13/049,762, 13 pages (mailed Aug. 3, 2012).

USPTO Non-Final Office Action for U.S. Appl. No. 13/049,762, 11 pages (mailed Jun. 18, 2013).

USPTO Non-Final Office Action for U.S. Appl. No. 13/049,762, 11 pages (mailed Dec. 27, 2013).

Vickridge et al., "Limiting step involved in the thermal growth of silicon oxide films on silicon carbide," Physical Review Letters, vol. 89, No. 25, pp. 256102-1 to 256102-4 (2002).

Wong et al., "Cross-section transmission electron microscopy study of carbon-implanted layers in silicon," Applied Physics Letters 57 (1990) 798-800.

Wong et al., "Infrared absorption spectroscopy study of phase formation in SiC layers synthesized by carbon implantation into silicon with a metal vapor vacuum arc ion source," Nuclear Instruments and Methods in Physics Research B, vol. 140, pp. 70-74 (1998).

Doolittle, Alan, "Lecture 5: Ion Implanation, Reading: Chapter 5," Georgia Tech.

Krumbein, Simeon, "Metallic Electromigration Phenomena," Presented at the $33^{rd}$ Meeting of the IEEE Holm Conference on Electrical Contacts, Chicago, Illinois, Sep. 21-23 (1987).

Li et al., "Effects of post-annealing on Schottky contacts of Pt/ZnO films toward UV photodetector," Journal of Alloys and Compounds, 509(26):7193-7197 (Abstract only) (2011).

USPTO Final Office Action for U.S. Appl. No. 13/049,762, 13 pages (mailed Mar. 1, 2013).

USPTO Final Office Action for U.S. Appl. No. 13/049,762, 14 pages (mailed Jun. 6, 2014).

USPTO Final Office Action for U.S. Appl. No. 14/086,826, 9 pages (mailed Aug. 29, 2014).

USPTO Non-Final Office Action for U.S. Appl. No. 13/049,762, 11 pages (mailed Aug. 3, 2012).

USPTO Non-Final Office Action for U.S. Appl. No. 14/086,826, 9 pages (mailed Apr. 10, 2014).

USPTO Notice of Allowance for U.S. Appl. No. 13/049,762, 10 pages (mailed Sep. 26, 2014).

USPTO Notice of Allowance for U.S. Appl. No. 14/086,826, mailed Feb. 9, 2015 (7 pages).

* cited by examiner

METAL STRUCTURES AND METHODS OF USING SAME FOR TRANSPORTING OR GETTERING MATERIALS DISPOSED WITHIN SEMICONDUCTOR SUBSTRATES

FIELD OF THE INVENTION

This application generally relates to transporting or gettering materials disposed within semiconductor substrates.

BACKGROUND OF THE INVENTION

As is known in the art of semiconductor processing, semiconductor substrates are susceptible to contamination that may degrade their electrical properties. In particular, although a semiconductor substrate initially may a relatively high purity when it is formed, subsequent processing of that substrate may introduce contamination. For example, silicon substrates of about 99.9999999% purity may be formed using known techniques, such as the Czochralski process. However, exposing that substrate to multiple materials processing steps, such as may be performed when fabricating electronic circuitry on the substrate, may contaminate the substrate with one or more elements, such as calcium, iron, or sodium. Additionally, the electronic circuitry itself may contaminate the semiconductor substrate over time. For example, FIG. 1A illustrates semiconductor substrate 110, upon which exemplary electronic circuitry 120 is disposed, and in which one or more active (doped) regions 111 may be defined. Electronic circuitry 120 may include conductive electrodes or interconnects, generally designated 121, which may be formed of a metal such as aluminum or copper. As illustrated in FIG. 1B, materials within electronic circuitry 120, and in particular conductive electrodes or interconnects 121, may diffuse into substrate 110 as contamination 130. In some circumstances, hydrogen also may be a contaminant. Among other things, such contamination may alter the semiconductive properties of active regions 111 and potentially may interfere with those regions' functionality.

Several methods, which may be referred to as "gettering," have been developed for reducing contamination within regions of semiconductor substrates. For example, the backside of a semiconductor substrate (the major surface opposite that upon which electronic circuitry 120 may be disposed) may be treated in a variety of ways intended to attract, or "getter," contamination. Such treatment may include damaging the backside of the substrate, such as with a laser beam or mechanical abrasion, so as to induce stress at that surface. Subsequently annealing the substrate may create dislocations within the crystal structure of the substrate that may attract and bind, or "getter," contaminants away from the circuitry-side of the substrate. Or, for example, the backside of the substrate may be exposed to a source of phosphorous so as to generate dislocations within the crystal structure of the substrate that may getter contaminants away from the circuitry-side of the substrate. Or, for example, the substrate may be treated so as to have a suitable percentage of oxygen therein, and subsequently may be treated to cause that oxygen to precipitate out as clusters that generate dislocations that may getter contaminants away from electronic circuitry 120 and active regions 111. FIG. 1C illustrates substrate 110' which has been modified to include treated region 112 on the backside of substrate 110'. Treated region 112 has been damaged, exposed to phosphorous, or otherwise treated so as to getter contamination 130 out of circuitry-side region 113, which may be referred to as a "denuded zone," and into contaminated region 114, which is disposed beneath circuitry-side region 113. Region 112 of substrate 110' may be treated before electronic circuitry 120 is disposed on the substrate.

Gettering methods such as described above may require relatively harsh treatments to the entire semiconductor substrate, and may reduce the mechanical stability of the semiconductor substrate. Thus, what is needed is an improved method for gettering materials disposed within a semiconductor substrate, and more generally for transporting materials disposed on or within a semiconductor substrate.

SUMMARY OF THE INVENTION

Embodiments of the present invention provide metal structures for transporting or gettering materials disposed on or within a semiconductor substrate.

Under one aspect of the present invention, a structure is provided for transporting a material disposed on or within a semiconductor substrate. The structure includes a metal structure disposed within the semiconductor substrate and at a spaced distance from the material. The metal structure is configured to transport the material through the semiconductor substrate and to concentrate the material at the metal structure.

In some embodiments, the material includes a contaminant disposed within the semiconductor substrate. The structure further may include electronic circuitry disposed on the semiconductor substrate, and the contaminant includes a second metal originating from the electronic circuitry. The semiconductor substrate may include, for example, silicon. The metal structure may include, for example, platinum. The second metal may include, for example, H, Al, Ca, Cu, Fe, or Na. The contaminant may diffuse through the semiconductor substrate and may interfere with operation of the electronic circuitry in the absence of the metal structure.

The metal structure may include, for example, Al, Au, Ag, Ca, Cu, K, Li, Mn, Na, Pt, or Rb. The material may include a second metal, such as H, Al, Au, Ag, Ca, Cu, K, Li, Mn, Na, Pt, or Rb, preferably which is different than the metal of the metal structure.

In some embodiments, the substrate may have an aperture defined in an upper surface thereof, and the metal structure may be disposed within the aperture. Alternatively, the metal structure may be disposed within the substrate using ion implantation. The material may be disposed within the substrate using ion implantation.

Under another aspect of the present invention, method is provided for transporting a material disposed on or within a semiconductor substrate. The method may include disposing a metal structure within the semiconductor substrate and at a spaced distance from the material; transporting the material through the semiconductor substrate with the metal structure; and concentrating the material at the metal structure.

DETAILED DESCRIPTION

Figure 1A:
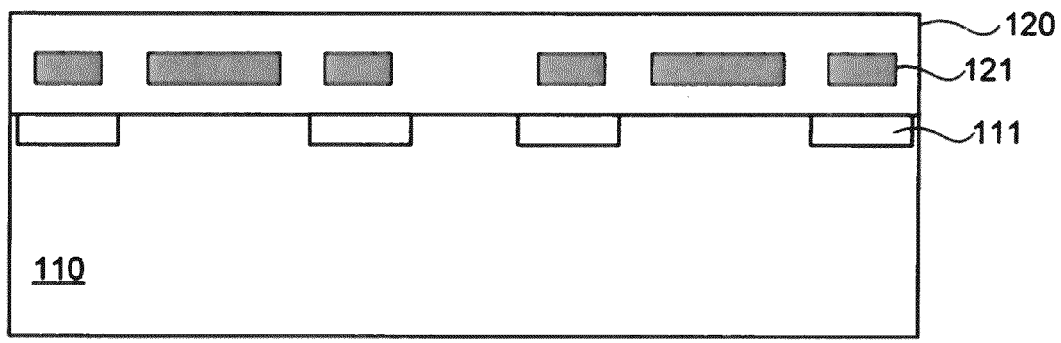
FIG. 1A schematically illustrates a cross-section of a previously known semiconductor substrate having electronic circuitry disposed thereon.
Figure 1B:
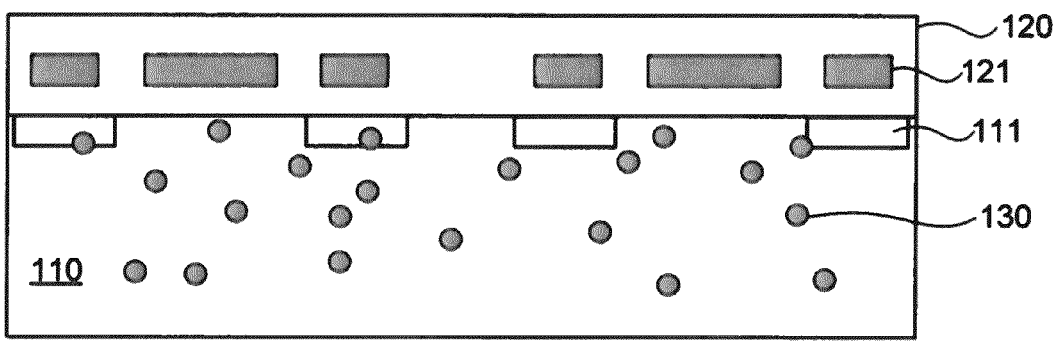
FIG. 1B schematically illustrates contamination of the previously known semiconductor substrate of FIG. 1A originating from the electronic circuitry disposed thereon.

Embodiments of the present invention provide metal structures for transporting or gettering materials within a semiconductor substrate. The metal structures may be disposed near the surface of the substrate, e.g., may be disposed within apertures that are defined within the substrate, or may be embedded below the surface of the substrate, e.g., using ion implantation. The metal structures are configured to attract a material within the substrate, so as to transport the material thereto laterally or vertically through the substrate, and to concentrate the material at the metal structure. Where the material is a contaminant, such a transportation process may be referred to as "gettering." However, the same process suitably may be applied to transport materials other than contaminants through a substrate, for example to form functional structures of those materials within the substrate. That is, gettering is a particularly useful subset of the material transportation processes provided herein.

In particular, the present inventors have recognized that a suitable metal structure within a semiconductor substrate may be used to modify the behavior of another material that is disposed on, or within, the substrate. For example, in the absence of the metal structure, a contaminant may diffuse into or through the substrate, or a material may remain disposed in a particular plane or location on or within the substrate. The metal structure may cause the contaminant instead to become concentrated at the metal structure, or may cause the material to move out of the plane or location and into a new plane or location at the metal structure. Without wishing to be bound by theory, it is believed that the metal structure modifies the local environment experienced by the contaminant or other material, driving the contaminant or other material to favor different kinetic and thermodynamic processes (including concentration or diffusion) than it would without the metal structure present. Moreover, the specific pressure created by the surrounding substrate and temperature changes created by heating also may modify the local environment of the contaminant or other material. Thus, by controlling the characteristics of the metal structure relative to the substrate, and by heating the substrate as appropriate, a contaminant or other material may be controllably transported through the substrate. As such, embodiments of the present invention enable the preparation of semiconductor-based electronic devices with reduced contamination, as well as different structures than otherwise may not readily be prepared using previously known techniques.

First, several exemplary metal structures, and the use thereof for transporting or gettering a material disposed on or within a semiconductor substrate, will be described. Then, an exemplary method and system for preparing and using such structures will be described. An example of a structure that was observed to transport material within a semiconductor substrate then will be described.

Figure 2A:
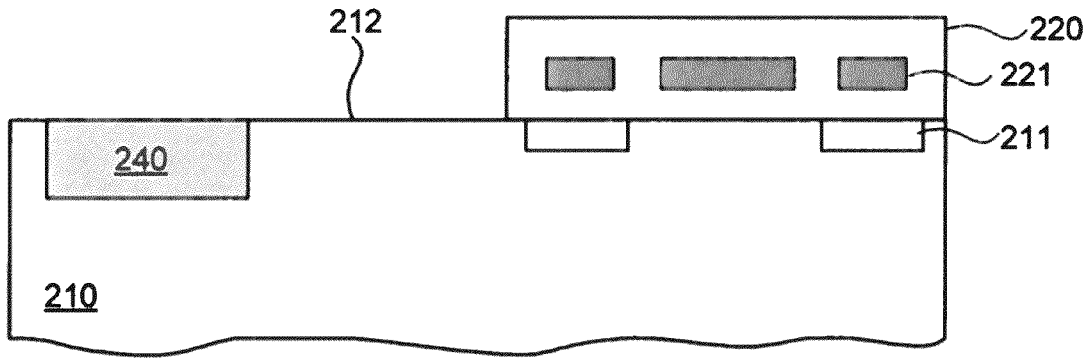
FIGS. 2A-2C schematically illustrate cross-sectional views of an exemplary metal structure that may be used to getter contamination in a semiconductor substrate having electronic circuitry thereon, according to some embodiments of the present invention.
Figure 2B:
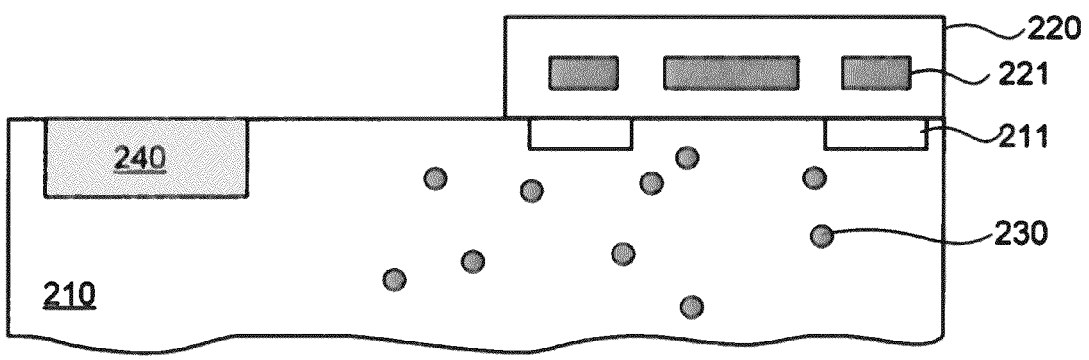
Figure 2C:
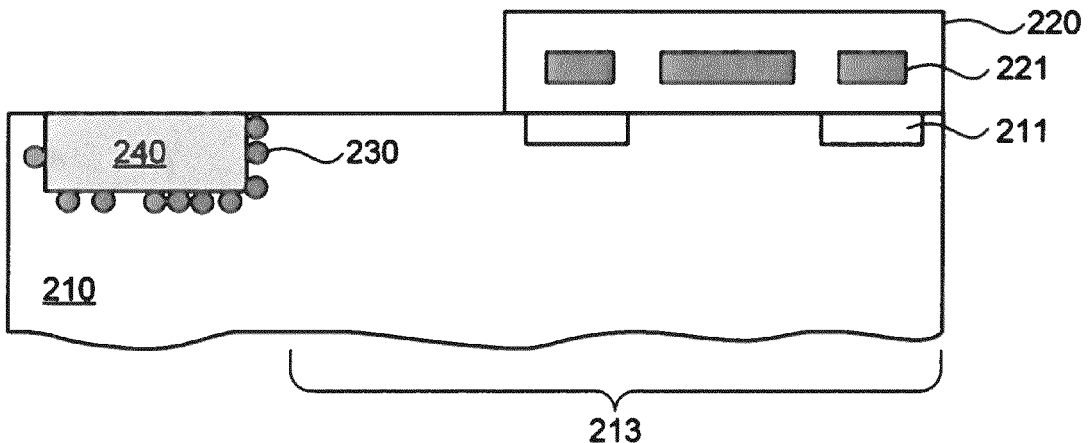

FIGS. 2A-2C schematically illustrate a first exemplary metal structure 240 configured to transport a material, e.g., to getter a contaminant, within semiconductor substrate 210. Specifically, metal structure 240 is disposed within substrate 210, and beneath upper surface 212 thereof. Preferably, metal structure 240 also is disposed at a spaced distance from electronic circuitry 220 disposed on upper surface 212 of substrate 210. Metal structure 240 may be laterally displaced from electronic circuitry 220 may any suitable distance, e.g., by about 10 nm or more, or by about 50 nm or more, or by about 100 nm or more, or by about 500 nm or more, or by about 1 micron or more, or by about 10 microns or more, e.g., between about 10 nm to 10 microns, or between about 100 nm to 1 micron. In one illustrative embodiment, metal structure 240 is disposed within an aperture defined in the upper surface 212 of substrate 210. Metal structure 240 may be formed from a suitable metal such as aluminum (Al), gold (Au), silver (Ag), calcium (Ca), copper (Cu), potassium (K), lithium (Li), manganese (Mn), sodium (Na), platinum (Pt), or rubidium (Rb), or a combination thereof. In one exemplary embodiment, metal structure 240 includes Pt. Note that metal structure 240 need not necessarily be disposed entirely within substrate 210, and that some portion of metal structure 240 suitably may extend beyond upper surface 212 of the substrate without modifying the functionality of the metal structure. Additionally, metal structure 240 need not necessarily be formed purely of metal. For example, in the Example section further below, a composition including about 60-70% platinum and about 30-40% carbon suitably may be used as a metal structure.

Semiconductor substrate 210 may be formed of silicon, germanium, gallium phosphide, gallium nitride, gallium arsenide, indium phosphide, or other suitable semiconductor material, and may be of relatively high initial purity. For example, as noted above, silicon substrates formed using the Czochralski process may have a purity of 99.9999999%. Substrate 210 may include structures defined therein, such as conductive lines, insulator layers, doped semiconductor regions, and the like, such as illustrative active region 211. Electronic circuitry 220 disposed on upper surface 212 of substrate 210 may include conductive electrodes or interconnects, generally designated 221. Such electrodes or interconnects 221 may be formed of Al or Cu, as well as other structures and materials such as conductors, insulators, and semiconductors (not specifically illustrated).

As noted above, semiconductor substrates with electronic circuitry thereon are susceptible to contamination. FIG. 2B illustrates contamination 230, which may be seen to diffuse both laterally and vertically within semiconductor substrate 210. Contamination 230 may originate from a variety of sources, including processing steps to which substrate 210 is exposed, or from materials within electronic circuitry 220, such as conductive electrodes or interconnects 221. When present in sufficient concentration, such contamination 230 may interfere with the operation of electronic circuitry 220 or active areas 211, thus degrading the performance of electronic devices based on substrate 210. Elements that commonly contaminate semiconductor substrates may include metals such as hydrogen (H), aluminum (Al), calcium (Ca), copper (Cu), iron (Fe), and sodium (Na). Copper or aluminum within electrodes or interconnects 221 are exemplary sources of contamination 230. Additionally, stainless steel in the environment surrounding substrate 210 may liberate H, which then may diffuse into substrate 210, particularly in a vacuum environment. The tendency of contamination 230 to diffuse or concentrate within substrate 210 depends on the physical and chemical nature of the contamination. For example, aluminum's tendency to diffuse within a silicon substrate is well known. The relative concentration of contamination 230 within substrate 210 may increase proportionally to the temperature of the substrate.

As illustrated in FIG. 2C, metal structure 240 is configured to getter contamination 230, e.g., to transport contamination 230 through substrate 210 and to concentrate that contamination at the metal structure. Specifically, without wishing to be bound by theory, it is believed that metal structure 240 may generate a local environment for contamination 230 that has a significantly lower energy than other regions of substrate 210, and thus may attract contamination 230 to the interface between metal structure 240 and substrate 210. As such, contamination 230 may be substantially concentrated at metal structure 240, while substrate region 213 may have a reduced level of contamination, and indeed even may be substantially free of contamination 230. Metal structure 240 and substrate region 213 may be seen in FIG. 2C to be arranged laterally relative to one another. In circumstances in which contamination 230 originates from electronic circuitry 220, the distance between metal structure 240 and that contamination may be defined by the lateral distance between the metal structure and the electronic circuitry. Preferably, metal structure 240 is formed of a different material than is contamination 230, although it should be appreciated that in some circumstances the metal structure and contamination 230 may have the same composition as one another.

Figure 1C:
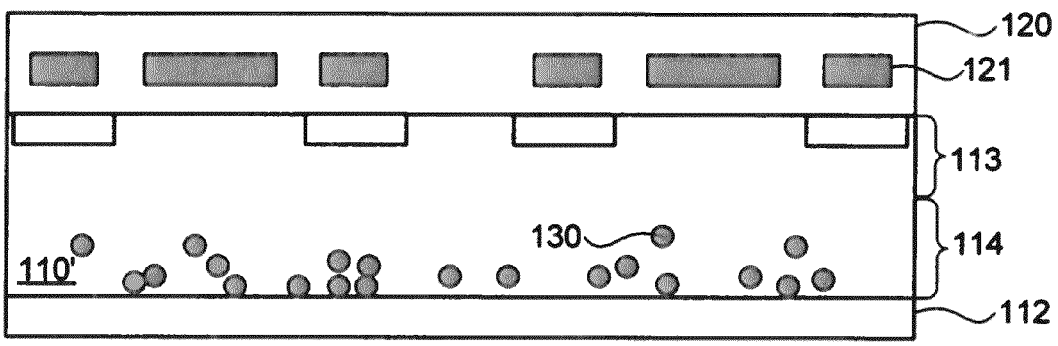
FIG. 1C schematically illustrates a previously known structure for gettering contamination within the semiconductor substrate of FIG. 1B.

Because the power of metal structure 240 to getter contamination 230 may decrease as a function of increasing distance between the structure and the contamination, metal structure 240 preferably is located sufficiently close to electronic circuitry 220 so as to substantially getter contamination originating therefrom, but sufficiently far from the electronic circuitry so as to inhibit any contamination concentrated thereat from interfering with operation of the circuitry. Indeed, an suitable number of such metal structures 240 may be disposed within substrate 110 and at spaced distances from electronic circuitry 220 so as to achieve sufficient gettering of contamination 230. In comparison, the distance between treated region 112 and electronic circuitry 120 illustrate in FIG. 1C is defined by the thickness of substrate 110, and contaminated region 114 and circuitry-side region 113 accordingly are arranged relative to one another along the thickness dimension of substrate 110. The thickness of substrate 110, and thus the distance between treated region 112 and electronic circuitry 120 in FIG. 1C, is substantially fixed, and may be significantly larger than the distance between metal structure 240 and electronic circuitry 220 in FIG. 2C. Without wishing to be bound by any theory, it is believed that providing a suitably short distance between metal structure 240 and electronic circuitry 220 may getter contamination 230 particularly effectively. Additionally, it is believed that suitably heating substrate 210 may enhance the ability of metal structure 240 to getter contamination within the substrate.

Figure 3A:
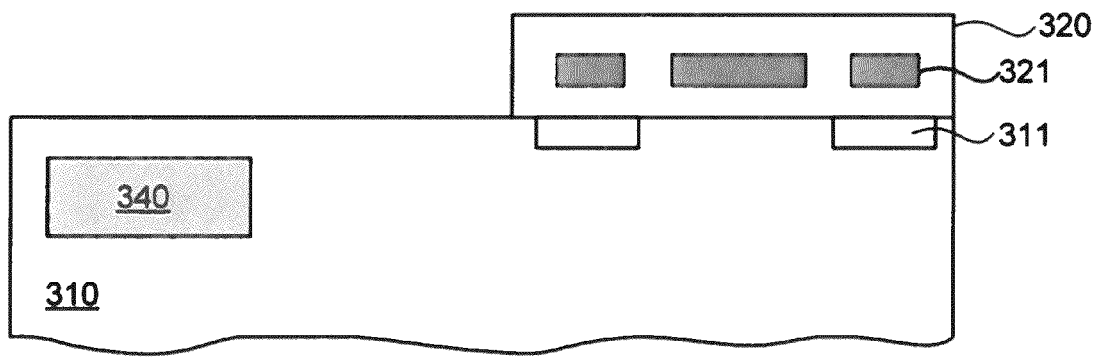
FIGS. 3A-3C schematically illustrate cross sectional views of an alternative exemplary metal structure that may be used to getter contamination in a semiconductor substrate having electronic circuitry thereon, according to some embodiments of the present invention.
Figure 3B:
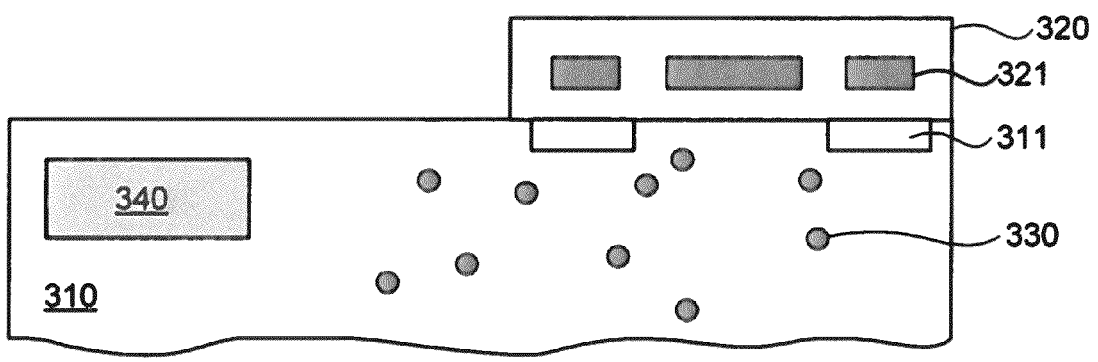
Figure 3C:
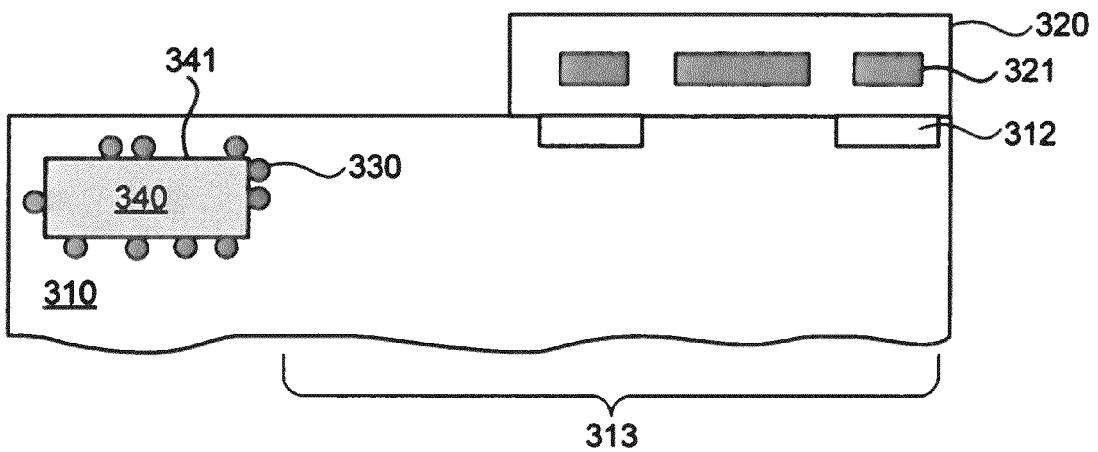

Although FIGS. 2A-2C illustrate metal structure 240 as being disposed just beneath the top surface 212 of substrate 210, it should be understood that the metal structure suitably may be provided at any depth within the substrate. For example, FIGS. 3A-3C illustrate alternative metal structure 340 that is completely embedded within substrate 310, upon which is disposed electronic circuitry 320 having electrodes or interconnects 321 disposed therein. In a manner analogous to that described above with reference to FIGS. 2A-2C, metal structure 340 getters contamination 330 disposed within substrate 310, that is, transports and accumulates contamination 330 thereto so as to define substrate region 313 which has a reduced level of contamination, and indeed even may be substantially free of contamination. However, note that metal structure 340 includes additional upper surface 341 that metal structure 240 lacks, and thus provides an additional interface between metal structure 340 and substrate 310 at which contamination 330 may concentrate.

Figure 4A:
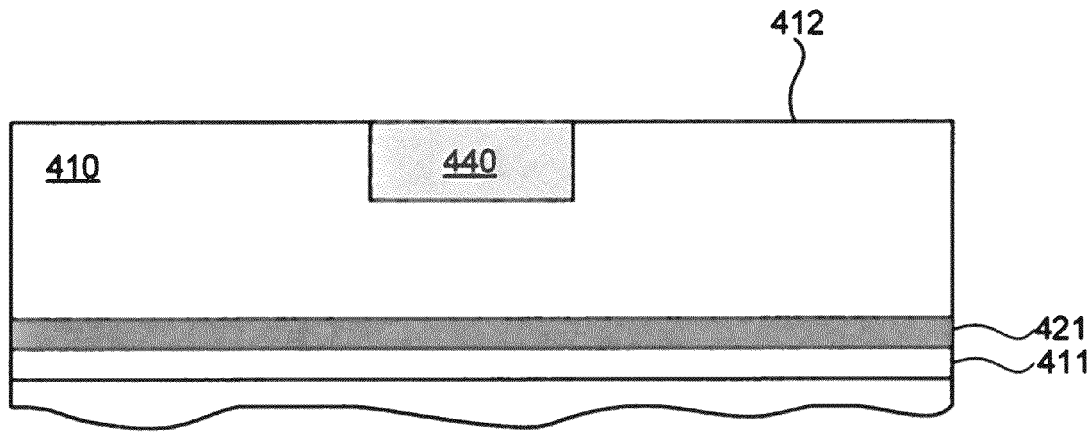
FIGS. 4A-4C schematically illustrate cross-sectional views of an exemplary metal structure that may be used to transport a material disposed within a semiconductor substrate, according to some embodiments of the present invention.

As noted above, gettering is only one exemplary type of material transport process that may be facilitated by the present metal structures. Indeed, the present metal structures suitably may be adapted to facilitate transport of a desired material, and in particular a metal, within a substrate. For example, FIG. 4A illustrates semiconductor substrate 410 having optional diffusion blocking layer 411, metal layer 421, and metal structure 440 disposed therein. Metal structure 440 may be disposed just below upper surface 412 of substrate 410, in a manner analogous to that of metal structure 240 described further above with reference to FIG. 2A. Metal structure 440 may be vertically displaced from metal layer 421 by any suitable distance, e.g., by about 10 nm or more, or by about 50 nm or more, or by about 100 nm or more, or by about 500 nm or more, or by about 1 micron or more, or by about 10 microns or more, e.g., between about 10 nm to 10 microns, or between about 100 nm to 1 micron.

Metal layer 421 may be disposed adjacent to diffusion blocking layer 411, and both of layers 421, 411 may be disposed at a defined depth within substrate 410. Diffusion blocking layer 411 may be formed of any suitable material, such as silicon dioxide, silicon carbide, graphene, or diamond like carbon. Both metal layer 421 and metal structure 440 may be made from a metal such as Al, Au, Ag, Ca, Cu, K, Li, Mn, Na, Pt, or Rb, although the metal of the metal layer preferably is different than the metal of the metal structure. Exemplary methods of using ion implantation to form diffusion blocking layers and metal layers are described in greater detail in U.S. Patent Publication No. 2012/0235281, published Sep. 20, 2012 and entitled "Systems and Methods for Preparing Films Comprising Metal Using Sequential Ion Implantation, and Films Formed Using Same," the entire contents of which are incorporated by reference herein.

Figure 4B:
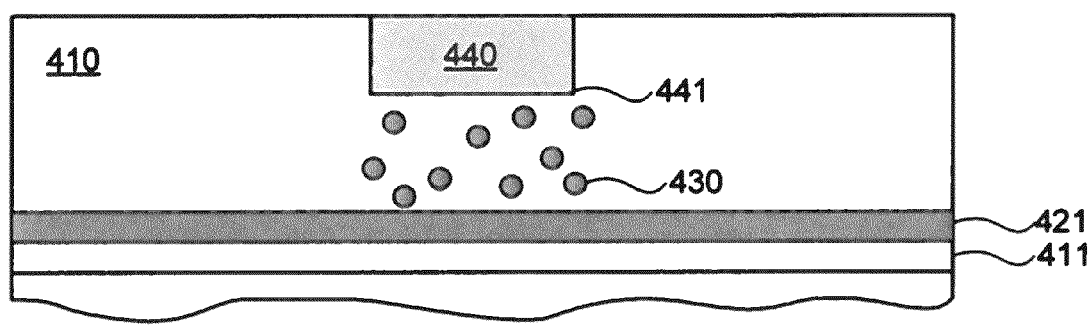
Figure 4C:
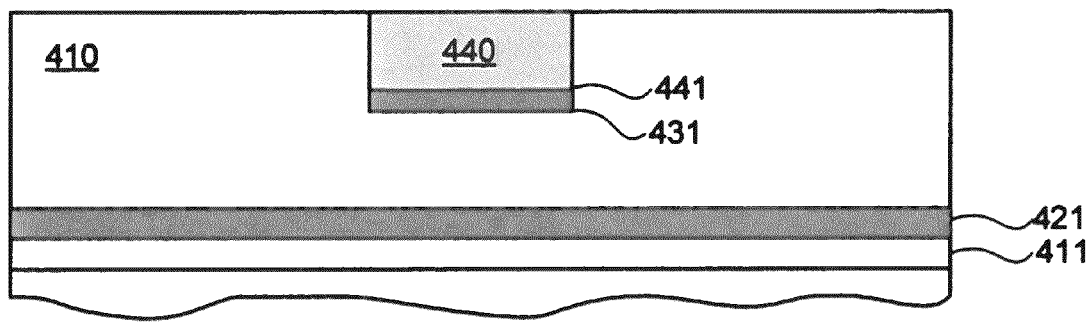

As illustrated in FIGS. 4B-4C, metal structure 440 is configured to transport metal from metal layer 421 through semiconductor substrate 410 and to concentrate the transported metal at lower surface 441 of the metal structure. In particular, the metal from metal layer 421 may form metal film 431 that is disposed on lower surface 441, that may be electrically conductive, substantially continuous, and that may form a functional structure within substrate 410. Note that only a portion of the metal within metal layer 421 may be transported to metal structure 440. Accordingly, the structure resulting from the transport process caused by metal structure 440 includes the metal structure, metal film 431 disposed on the lower surface thereof, and metal layer 421 disposed at a spaced distance therefrom. Additionally, optional diffusion blocking layer 411 preferably inhibits metal within metal layer 421 from being transported downwards through the depth of substrate 410 so as to enhance the conductivity and stability of metal layer 421. Note that the metal from metal layer 421 suitably may concentrate at other surfaces of metal structure 440 in addition to lower surface 441. Additionally, suitably heating substrate 410 may facilitate transport and concentration of the metal from metal layer 421 at metal structure 440.

Additionally, it should be noted that in some embodiments, the transport of metal from metal layer 421 to metal structure 440 may be "self-limiting." Specifically, formation of metal film 431 on the lower surface 441 of metal structure 440 may modify the metal structure's ability to transport the metal from metal layer 421 to lower surface 441. Accordingly, metal film 431 may grow to a thickness based on the attraction between metal structure 440 and metal layer 421 and based on a reduction in that attraction that may be caused by the presence of metal film 431.

Figure 5A:
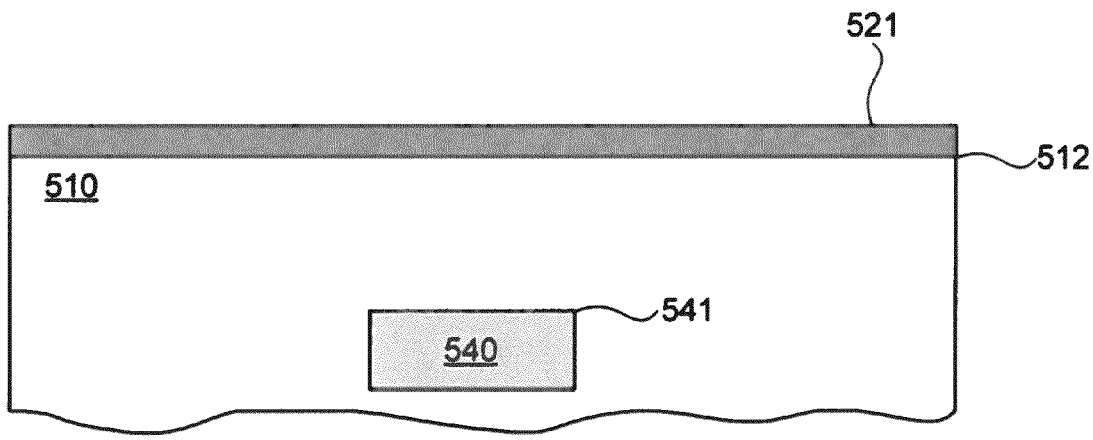
FIGS. 5A-5C schematically illustrate cross-sectional views of an exemplary metal structure that may be used to transport a material disposed on a semiconductor substrate, according to some embodiments of the present invention.

Although FIGS. 4A-4C illustrate metal structure 440 as being disposed just beneath the top surface 412 of substrate 410, it should be appreciated that the metal structure suitably may be disposed at any depth within the substrate, such as metal structure 340 described above with reference to FIGS. 3A-3C. Indeed, the metal structure and the metal layer suitably may be arranged in any position relative to one another. For example, FIG. 5A illustrate alternative metal structure 540 that is entirely embedded below upper surface 512 of semiconductor substrate 510, and alternative metal layer 521 that is disposed on upper surface 512. The spacing between metal structure 540 and metal layer 521 may be similar to that described above for metal structure 440 and metal layer 421 described above with reference to FIGS. 4A-4C.

Figure 5B:
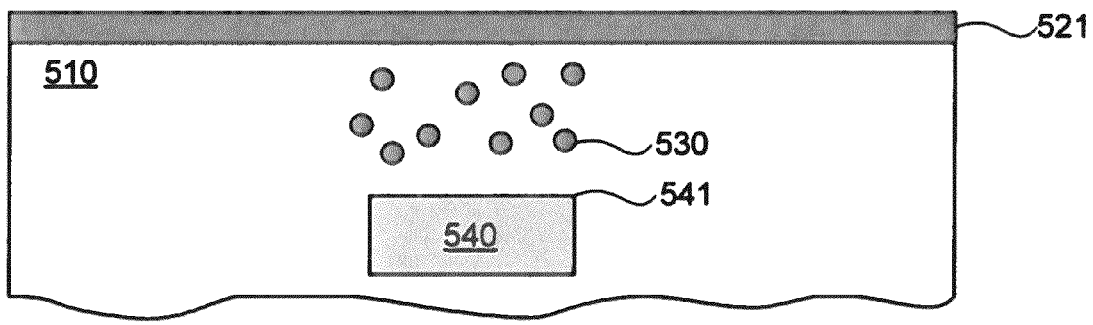
Figure 5C:
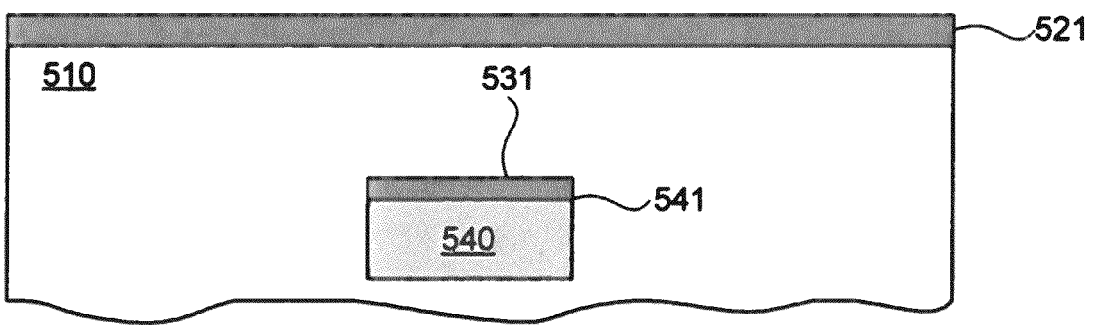

As illustrated in FIGS. 5B-5C, metal structure 540 is configured to transport metal from metal layer 521 through semiconductor substrate 510 and to concentrate the transported metal at upper surface 541 of the metal structure. In particular, the metal from metal layer 521 may form metal film 531 that is disposed on upper surface 541, that may be electrically conductive, substantially continuous, and that may form a functional structure within substrate 510. Note that only a portion of the metal within metal layer 521 may be transported to metal structure 540. Accordingly, the structure resulting from the transport process caused by metal structure 540 includes the metal structure, metal film 531 disposed on the upper surface thereof, and metal layer 521 disposed at a spaced distance therefrom, on the upper surface of substrate 510. Note that the metal from metal layer 521 suitably may concentrate at other surfaces of metal structure 540 in addition to upper surface 541, and that suitable heating may facilitate transport of the metal to metal structure 540.

As illustrated by the exemplary arrangements of FIGS. 2A-5C, it should be appreciated that the present metal structures may be provided in any suitable location within a semiconductor substrate and may be used to transport or getter materials, and particularly metals, disposed at any suitable location on or within the substrate. An exemplary method of preparing such metal structures now will be described with reference to FIG. 6.

Figure 6:
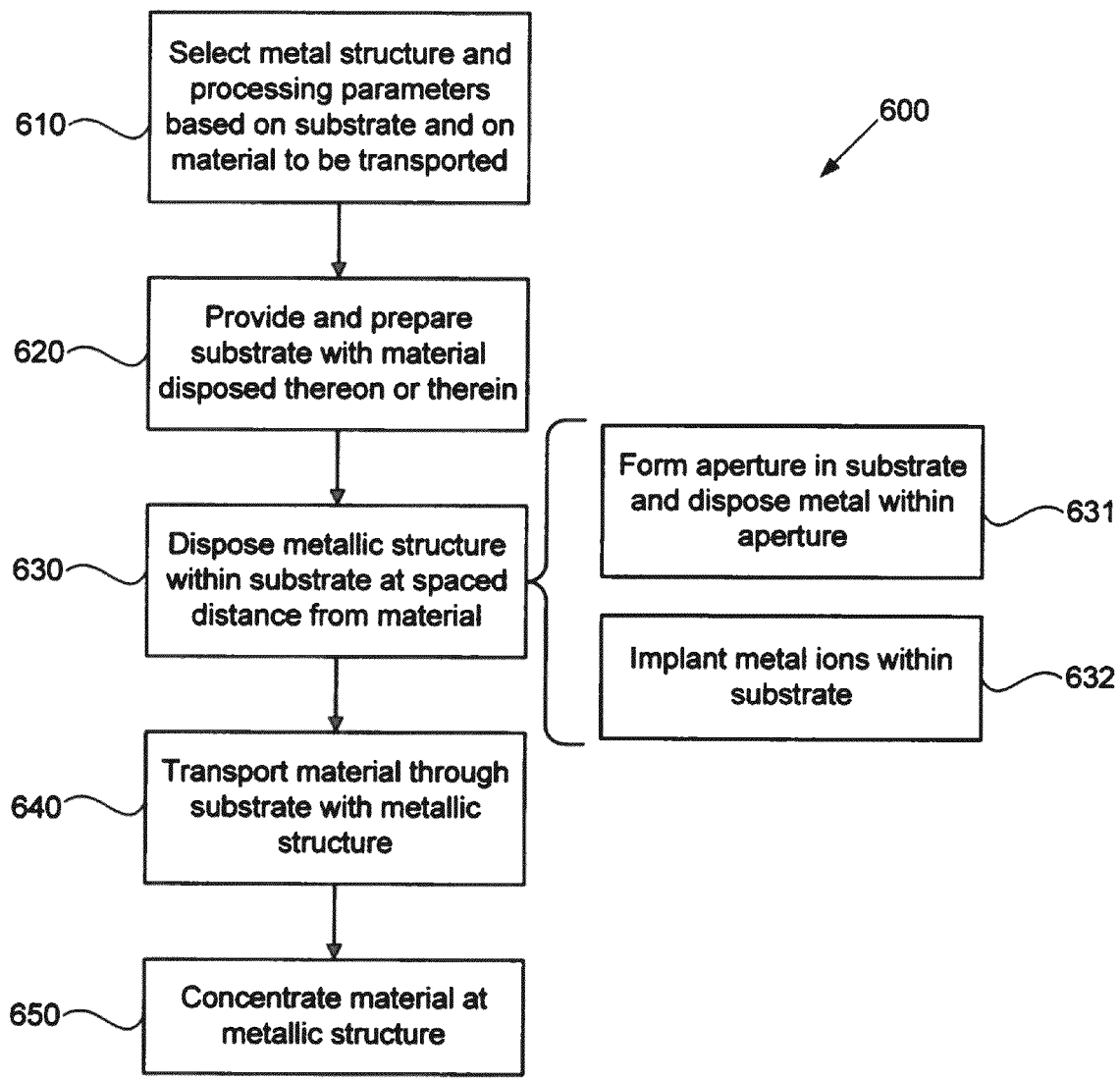
FIG. 6 is a flow chart of steps in an illustrative method for transporting or gettering a material disposed on or within a semiconductor substrate with a metal structure, according to some embodiments of the present invention.

FIG. 6 illustrates an overview of an exemplary method 600 for transporting a material disposed on or within a semiconductor substrate, and FIGS. 7A-8B illustrate exemplary structures that may be formed using such a method.

With reference to FIG. 6, based on a substrate and a material to be transported, a metal structure and processing parameters thereof selected (610). Specifically, a material may be expected to behave in a specific manner depending on the physical and chemical interactions between the material and the substrate. For example, the material may be expected to diffuse through the substrate, or to remain in a particular plane or location within the substrate. The size, shape, location, and composition of the metal structure may be selected to cause the material to be transported through the substrate and to concentrate at the metal structure, rather than to behave as it otherwise would have been expected to in the absence of the metal structure. Additionally, any suitable number and distribution of such metal structures may be provided to suitably transport the material. In one particularly preferred embodiment, a metal structure that includes platinum is selected to transport aluminum within a silicon substrate.

The selected processing parameters of the metal structure may include selecting whether to dispose the metal structure near the upper surface of the substrate, e.g., as illustrated in FIGS. 2A-2C and FIGS. 4A-4C, or to embed the metal structure entirely within the substrate, e.g., as illustrated in FIGS. 3A-3C and FIGS. 5A-5C. The selected processing parameters further may include selecting the manner in which the metal structure is to be formed. For example, if the metal structure is to be disposed near the upper surface of the substrate, then the processing parameters thereof may include parameters for defining an aperture within the upper surface of the substrate, e.g., using photolithography and etch steps such as known in the art, and parameters for disposing the metal within the aperture, e.g., using sputtering, electrodeposition, physical vapor deposition, chemical vapor deposition, ion-beam deposition, and the like, such as known in the art. Or, for example, if the metal structure is to be embedded entirely within the substrate, then the processing parameters thereof may include parameters for using ion implantation to embed the structure, e.g., may include identifying an ion source and defining the ion implantation dose, energy, and pattern that may be used to embed the structure within the substrate.

Then, the selected substrate, having the material to be transported disposed thereon or therein, is provided and prepared (620). Non-limiting examples of suitable semiconductor substrates include silicon, germanium, gallium phosphide, gallium nitride, gallium arsenide, and indium phosphide. The substrate may, for example, be a wafer, e.g., a single-crystal wafer, or may be a film disposed on a solid support such as glass or sapphire. The substrate may be monocrystalline, and optionally may have a particular crystalline orientation. For example, Si substrates are available in various crystallographic orientations, such as [100] or [111], either of which may be suitable. Alternatively, the substrate may be polycrystalline, or even amorphous. The material may be disposed thereon or therein using any suitable method. For example, as described above with reference to FIGS. 4A-4C, the material may include a metal layer embedded within the substrate, optionally which is disposed adjacent to a diffusion blocking layer. Exemplary methods of forming embedded metal layers and diffusion blocking layers using ion implantation is described in U.S. Patent Publication No. 2012/0235281, published Sep. 20, 2012 and entitled "Systems and Methods for Preparing Films Comprising Metal Using Sequential Ion Implantation, and Films Formed Using Same," the entire contents of which are incorporated by reference herein. Or, for example, as described above with reference to FIGS. 5A-5C, the material may include a metal layer disposed on the upper surface of the substrate. Methods for disposing metal layers on substrates are known, and may include sputtering, electrodeposition, physical vapor deposition, chemical vapor deposition, and the like. Alternatively, as described above with reference to FIGS. 2A-3C, the material may be contamination within the substrate, the origin of which may include, for example, processing steps to which the substrate is subjected, or electronic devices disposed on the substrate.

Figure 7A:
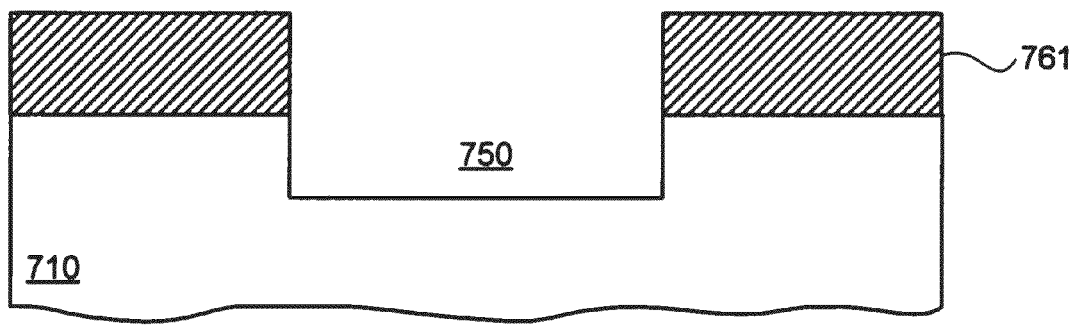
FIGS. 7A-7B schematically illustrate cross-sectional views of structures that may be formed while preparing a metal structure for transporting or gettering a material disposed on or within a semiconductor substrate, according to some embodiments of the present invention.
Figure 7B:
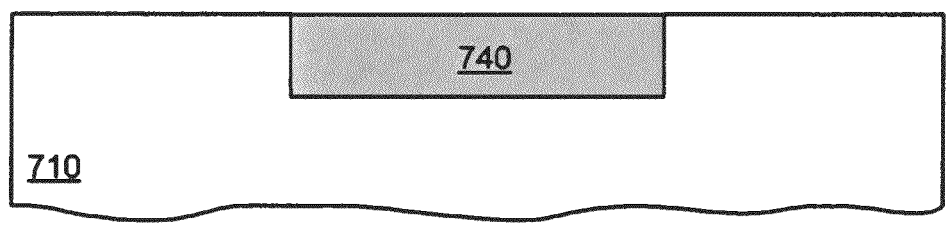

Then, the metallic structure is disposed within the substrate at a spaced distance from the material (step 630). Any suitable combination of steps may be used to dispose the metallic structure at a desired location within the substrate. For example, an aperture may be formed in the substrate and a metal disposed within the aperture (step 631). As illustrated in FIG. 7A, patterned mask 761 may be disposed on substrate 710, e.g., using deposition and lithographic patterning steps such as known in the art. Substrate 710 then may be etched using a suitable etchant so as to define aperture 750 disposed within the upper surface of the substrate. The mask subsequently may be removed. As illustrated in FIG. 7B, metal structure 740 then may be disposed within aperture 750, for example using sputtering, electrodeposition, physical vapor deposition, chemical vapor deposition, ion beam deposition, and the like.

Figure 8A:
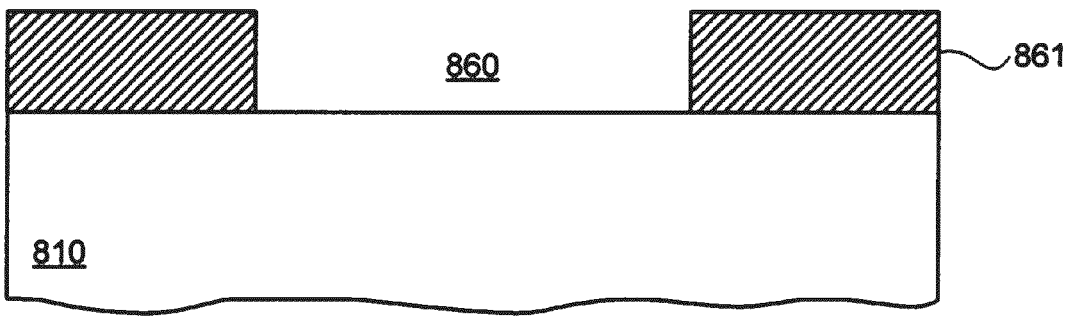
FIGS. 8A-8B schematically illustrate cross-sectional views of alternative structures that may be formed while preparing a metal structure for transporting or gettering a material disposed on or within a semiconductor substrate, according to some embodiments of the present invention.
Figure 8B:
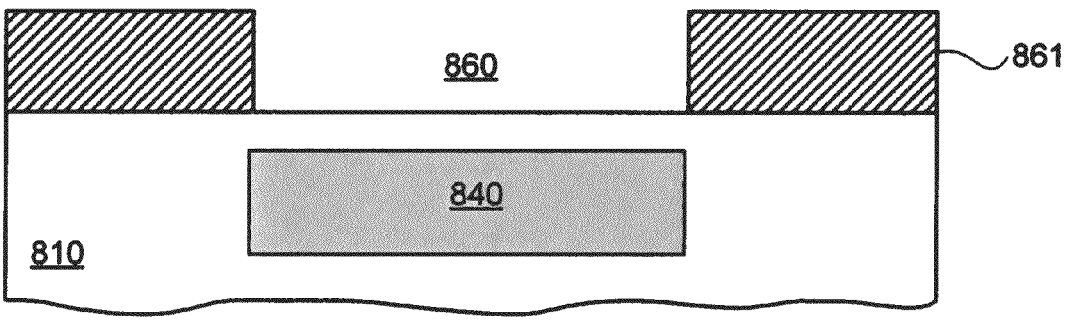

Or, for example, metal ions may be implanted within the substrate (step 632). As illustrated in FIG. 8A, patterned mask 861 may be provided on the upper surface of substrate 810 using techniques such as known in the art, e.g., using deposition and lithographic patterning steps, so as to define exposed area 860. As illustrated in FIG. 8B, metal ions then may be implanted within substrate 810 via exposed area 860, while mask 861 may inhibit the metal ions from penetrating into the regions of substrate 810 upon which it is disposed. Alternatively, a directed ion beam may be used to implant the metal ions in accordance with a desired pattern, thus obviating the need to use a patterned mask.

Note that steps 631 and 632 are intended to be illustrative, and it should be appreciated that other suitable methods of forming metallic structures may be used, including methods that have yet to be developed.

The material then may be transported through the substrate with the metallic structure (step 640) and concentrated at the metallic structure (step 650). Such transport and concentration may be facilitated by heating the substrate to a suitable temperature, e.g., to about 100° C. or less, or to about 200° C. or less, or to about 300° C. or less, or to about 400° C. or less, or to about 500° C. or less. Exemplary structures that may result from steps 640 and 650 are described further above with reference to FIGS. 2A-5C. However, it should be appreciated that a variety of structures may be formed using the method of FIG. 6. For example, metal films such as illustrated in FIGS. 4A-5C may be formed. Such films may be continuous, smooth, and electrically conductive, and may be used to perform an appropriate electrical function within the substrate. An exemplary film thus formed is described in greater detail below with reference to FIGS. 10A-11D.

Figure 9:
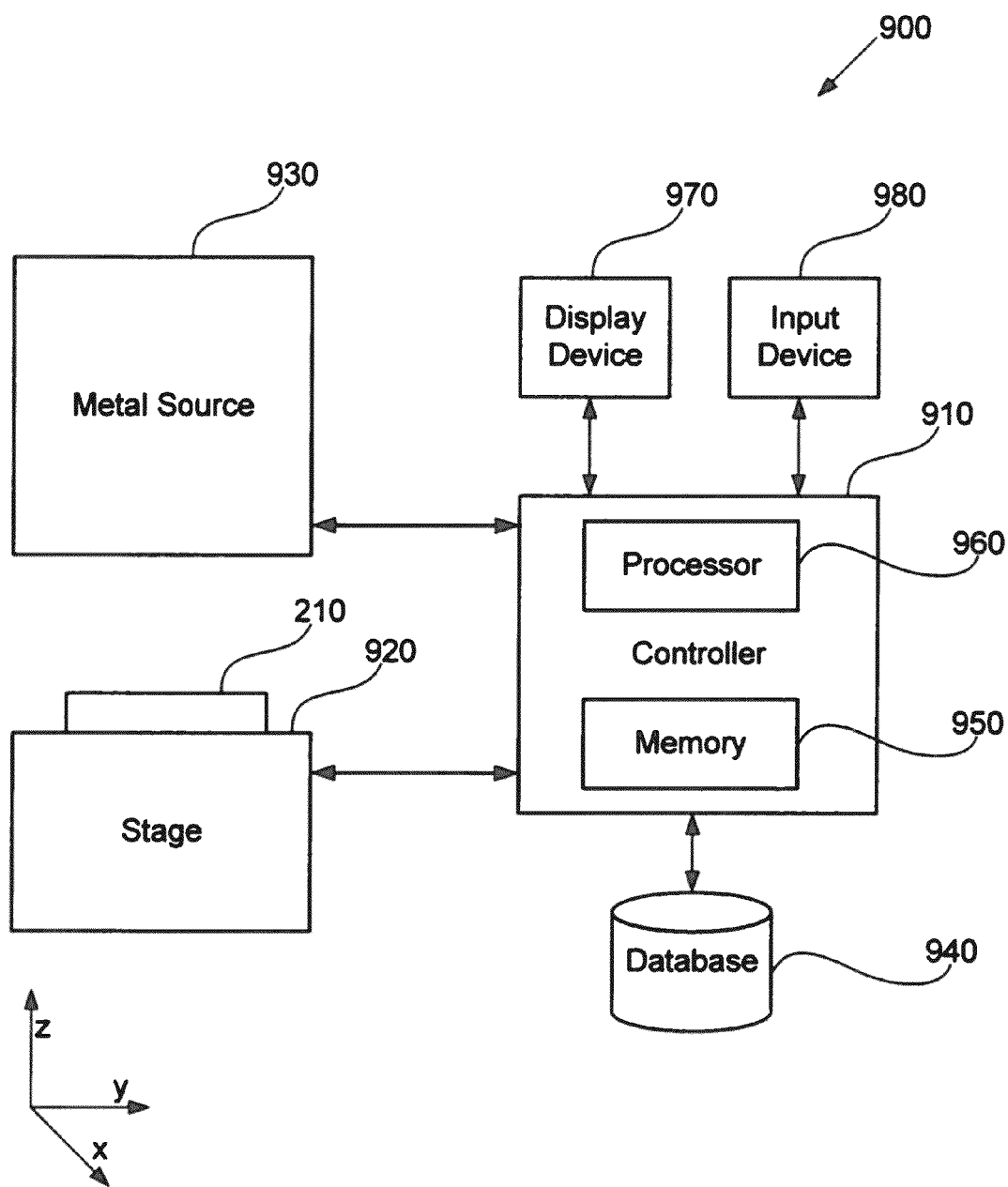
FIG. 9 schematically illustrates a system for preparing a metal structure for transporting or gettering a material disposed on or within a semiconductor substrate, according to some embodiments of the present invention.

FIG. 9 illustrates a system 900 for use in preparing films using sequential ion implantation, according to some embodiments. System 900 includes controller 910, stage 920, metal source 930, and database 940. Controller 910 is in operable communication with stage 920, metal source 930, and database 940. Controller 910 includes memory 950 for storing processing instructions, processor 960 for executing the stored processing instructions, display 970 for displaying data to a user, and input device 980 for accepting input from a user. Database 940 contains information on how to prepare a variety of different types of metal structures. Database 940 may be integral to controller 910, or may be remote to controller 910 and in operable communication with controller 910 via a network, such as the Internet. Stage 920 supports substrate 210, and is operable to adjust the position of the substrate in the x, y, and z directions responsive to instructions from controller 910, as well as to heat substrate 210 to a desired temperature. Substrate 210 preferably has disposed thereon or therein the material to be transported, although it should be understood that such material may be provided after forming the metal structure. Metal source 930 is configured to emit the metal from which the metallic structure is to be formed. For example, metal source 930 may include a sputterer, an electrodeposition apparatus, a physical vapor deposition apparatus, a chemical vapor deposition apparatus, or ion source. Metal source 930 is configured to emit the metal responsive to instructions from controller 910, optionally in accordance with a pre-selected pattern if desired and if a mask is not provided on the substrate.

Responsive to user input provided through input device 980, e.g., user input defining a desired metal structure to be prepared, controller 910 requests database 940 to provide information on how to prepare that type of metal structure. Responsive to the request, database 940 provides some or all of the following information to the controller 910: the type of substrate to be used (including the material disposed thereon or therein, and any masks to be disposed thereon); any required preparation thereof; the type of metal to be used to form the metal structure; and the processing parameters thereof. Controller 910 receives this information and stores it in memory 950. Processor 960 processes the stored information, and based on that information displays instructions to the user via display device 970 and controls stage 920 and metal source 930 to process the substrate 210 as appropriate.

In one example, the user uses input device 980, e.g., a keyboard and mouse, to input to the controller that he desires to prepare a metal structure such as illustrated in FIGS. 3A-3C that is formed of platinum (Pt), completely embedded within a silicon (Si) substrate, and configured to transport and concentrate contaminants that include aluminum (Al). Responsive to that input, controller 910 requests database 940 to provide information on preparing such a metal structure. Responsive to the request, database 940 provides a set of instructions to the controller 910, which controller 910 stores in memory 950. Processor 960 then processes the stored instructions to determine what information is to be displayed to the user via display device 970, and how the stage 920 and metal source 930 are to be controlled. For example, processor 960 determines, based on the stored instructions, that substrate 210 is to be an Si substrate, and that a patterned mask (not illustrated in FIG. 9) is to be provided thereon. Processor 960 then causes this information to be displayed to the user via display device 970 so that the user may separately obtain the Si substrate and provide the mask thereon.

Next, the user places the prepared Si substrate 210 on stage 920, and uses input device 980 to inform controller 910 that the substrate is ready. Responsive to this input, processor 960 instructs stage 920 to move to a pre-determined position in the x, y, and z direction for ion implantation and to heat substrate 210 to a pre-determined temperature, based on the stored instructions. Processor 960 then instructs metal source 930 to implant metal ions at the dose and energy defined in the stored instructions (step 632 in FIG. 6). Then, depending on the further processing defined in the stored instructions, processor 960 may display instructions to the user 970 regarding any steps the user is to perform, such as removing the mask from substrate 210.

It should be appreciated that any of the user-performed steps may alternatively be automated using commercially available equipment (not illustrated). For example, instead of displaying to the user what type of substrate and mask is to be provided, controller 910 may instead be in operable communication with a robotic substrate handler that may obtain substrate 210 from a substrate store, and may process the substrate as required to provide the mask. In one embodiment, one or more steps of an instruction sequence are made contingent on a feedback parameter. For example, the characteristics of the substrate may change as different steps (e.g., heating, ion implantation, etching), and these changes may be automatically characterized, for example using spectroscopy. The system may include instructions to move to a different step in the process after a pre-determined change to the substrate is characterized.

It should also be appreciated that the illustrative sequences of steps described above suitably may be modified so as to provide appropriate metal structures that are configured to transport and concentrate desired materials, and particularly metals, within a substrate.

Example

An exemplary platinum structure that was used to transport aluminum within a silicon substrate now will be described with reference to FIGS. 10A-11D. However, it should be understood that the example is not limiting, and that other metal structures suitably may be used to transport other materials, and particularly other metals, within other semiconductor substrates.

Figure 10A:
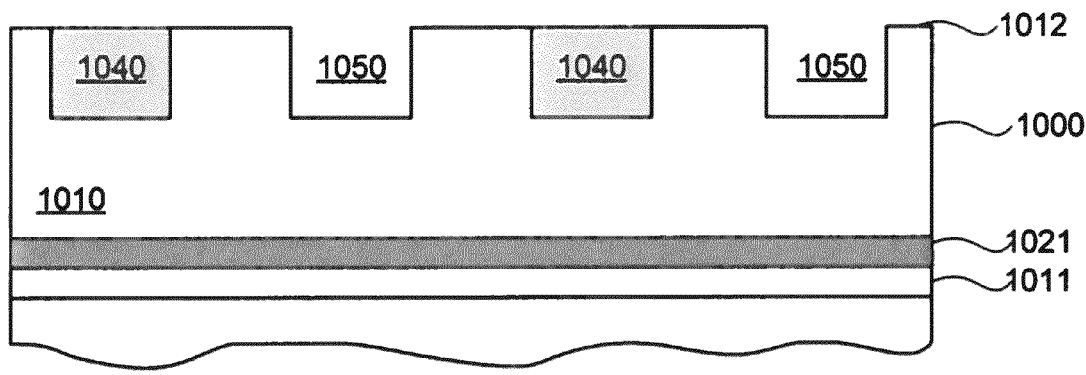
FIGS. 10A-10B respectively schematically illustrate cross-sectional and plan views of an exemplary structure that was prepared for transporting a material disposed within a semiconductor substrate.
Figure 10B:
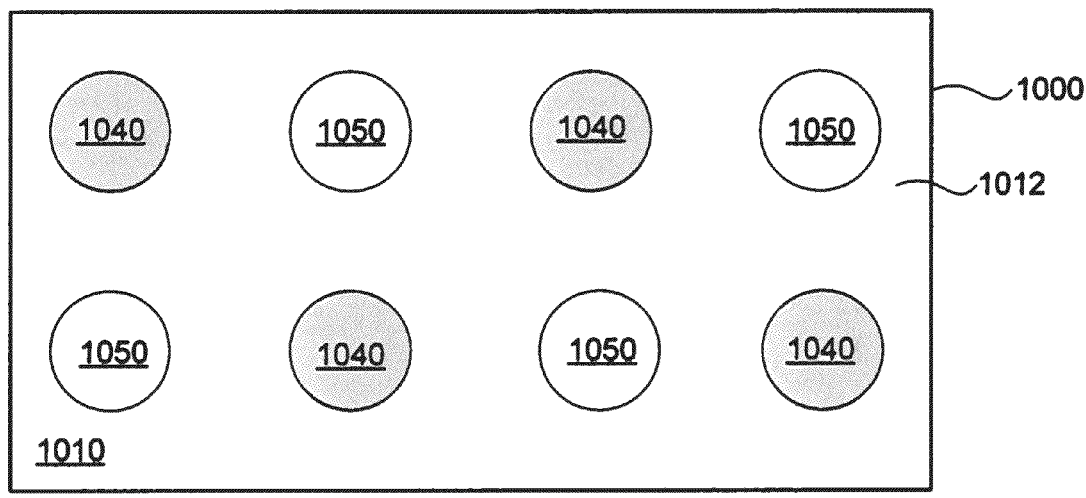
Figure 10C:
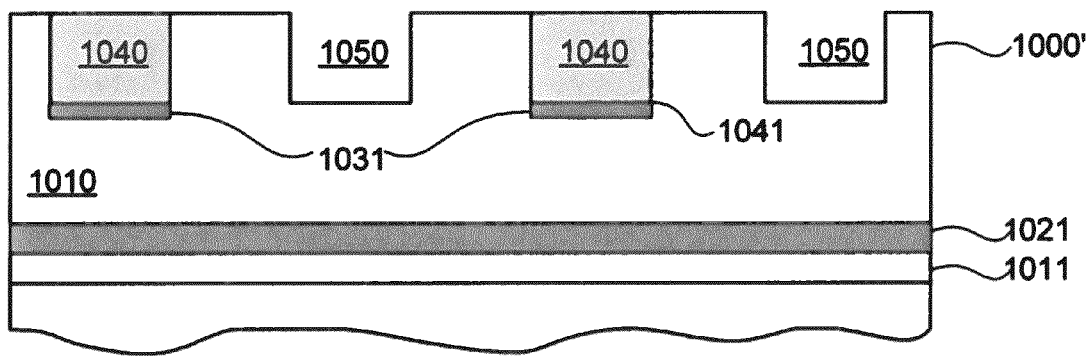
FIG. 10C schematically illustrates a cross-sectional view of the structure of FIGS. 10A-10B following transport of a material through the semiconductor substrate.

FIGS. 10A and 10B respectively illustrate cross-sectional and plan views of precursor structure 1000, which includes silicon substrate 1010 having a silicon dioxide diffusion blocking layer 1011 and aluminum layer 1021 disposed therein. Layers 1011 and 1021 were formed using methods described in Publication No. 2012/0235281. A plurality of apertures 1050 were defined within upper surface 1012 of substrate 1010 using a fast ion beam (FIB) instrument, and some of the apertures were filled with platinum using the same FIB instrument so as to form platinum structures 1040; the other apertures were left empty, as best seen in FIG. 10A. The resulting assembly then was heated to 500° C. for 96 hours. It was found that the resulting structure 1000' included aluminum films 1031 that were disposed on the lower surfaces 1041 of platinum structures 1040 but were not disposed on the lower surfaces of empty apertures 1050, as illustrated in FIG. 10C. Without wishing to be bound by any theory, it was believed that platinum structures 1040 transported aluminum from aluminum layer 1021 and caused that aluminum to concentrate at lower surfaces 1041 in a manner analogous to that described above with reference to FIGS. 4A-4C.

Figure 11A:
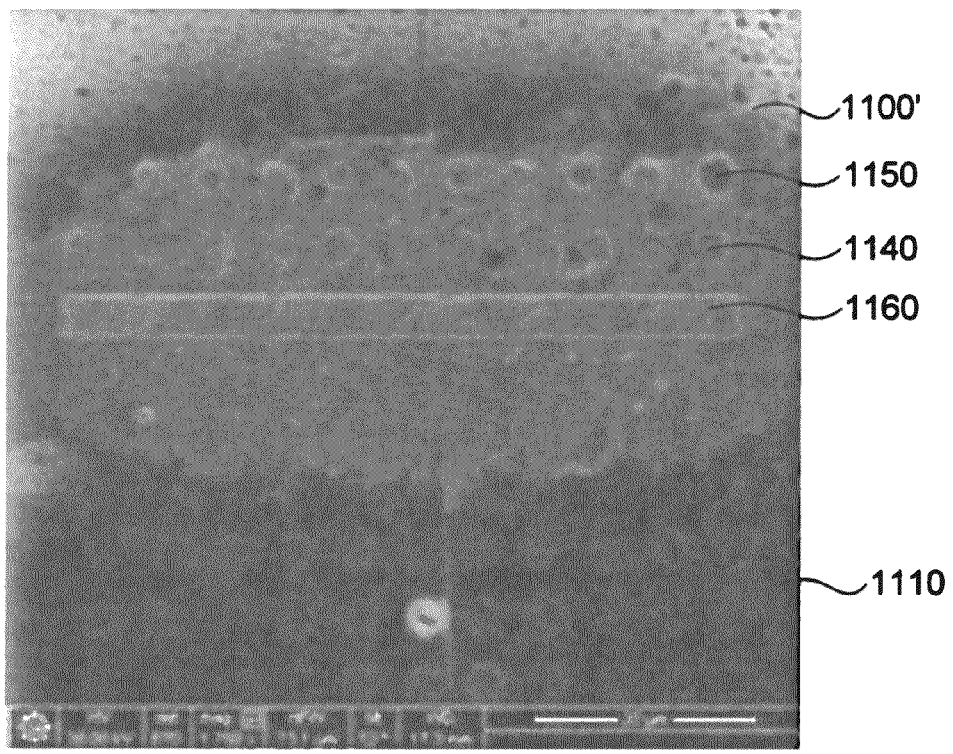
FIGS. 11A-11D are SEM images of exemplary structures formed in accordance with FIGS. 10A-10C and the method illustrated in FIG. 6.
Figure 11B:
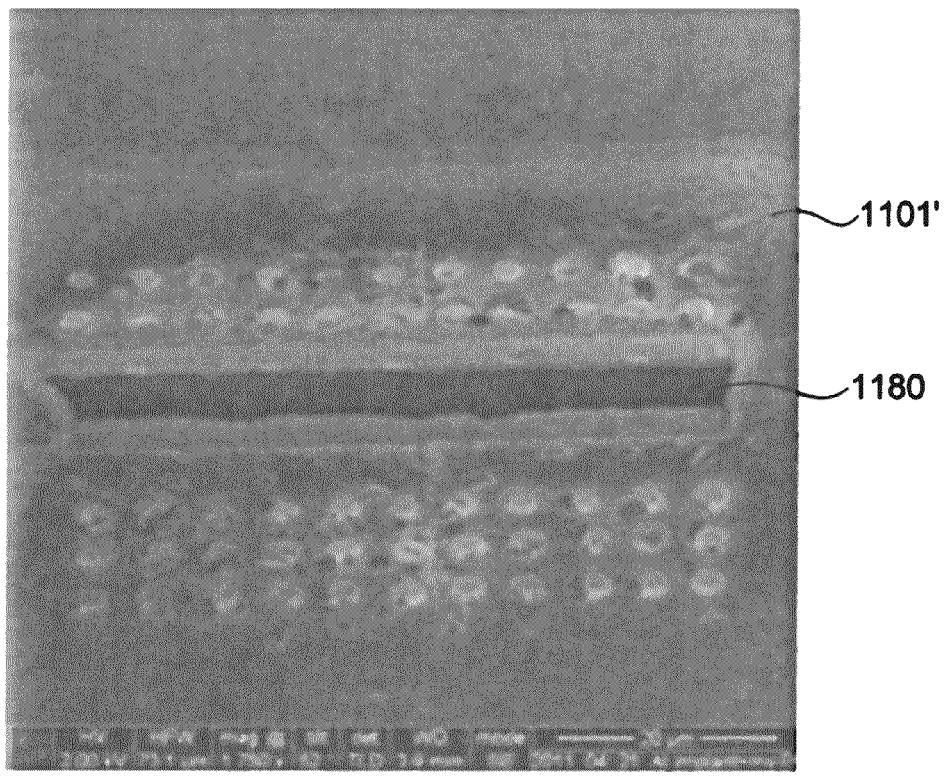

FIG. 11A is a scanning electron microscope (SEM) image of an exemplary structure 1100' having a construction analogous to that illustrated in FIG. 10C, e.g., that includes silicon substrate 1110 having empty apertures 1150 having a diameter between 1-2 microns defined therein, platinum-filled apertures defining platinum structures 1140 also having a diameter between 1-2 microns, an aluminum film 1121 disposed therein, and a silicon dioxide diffusion blocking layer 1111 disposed therein (films 1120 and 1111 not visible in FIG. 11A). Platinum structures 1140 were not formed of pure platinum, but instead contained approximately 30-40% carbon. Structure 1100' was prepared using the method of FIG. 6, followed by transporting and concentrating aluminum within film 1121 at platinum structures 1140 by heating substrate 1110. Layer 1160 is a platinum layer added to the sample to facilitate SEM imaging of a cross-section of structure 1100'. As may be seen in the SEM image of FIG. 11B, a free ion beam (FIB) instrument was used to excise a cross-section of structure 1100' for analysis, resulting in modified structure 1101'.

Figure 11C:
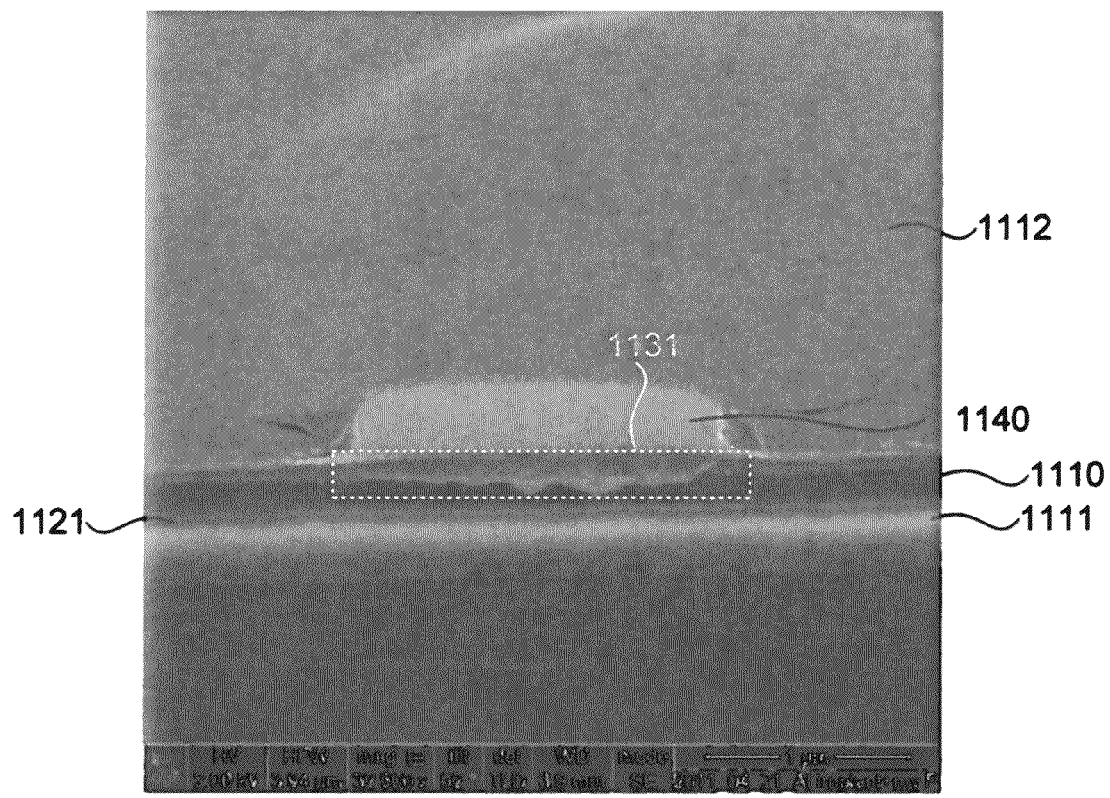
Figure 11D:
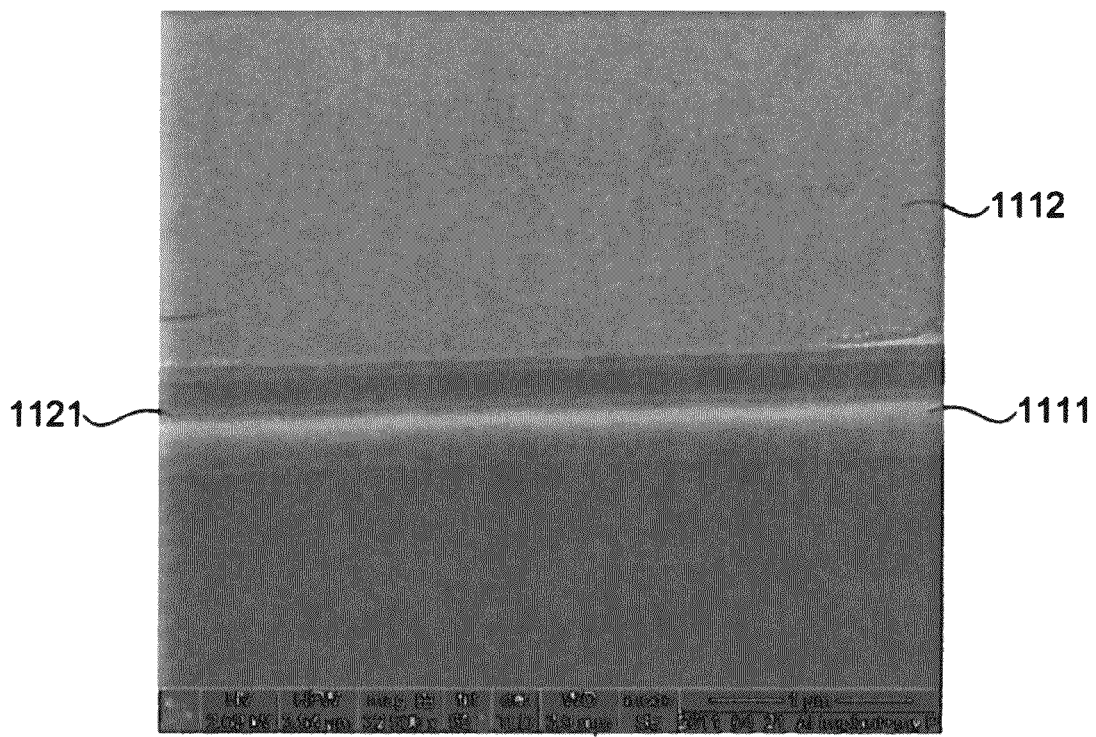

FIG. 11C is an SEM image of a cross-section of structure 1100' near a selected platinum structure 1140 formed within top surface 1112 of silicon substrate 1110. It may be seen that aluminum layer 1121 is disposed above silicon dioxide diffusion blocking layer 1111, and that aluminum film 1131 is disposed on the lower surface of platinum structure 1140. In comparison, FIG. 11D is an SEM image of a cross-section of structure 1100' in a region without apertures 1150 or platinum structures 1140, in which it may be seen that the aluminum substantially remained within layer 1121. Without wishing to be bound by any theory, it is believed that platinum structure 1140 transported aluminum within layer 1121 to the lower surface of structure 1140 and concentrated the transported aluminum so as to form an aluminum film within the region generally designated 1131. Such a result is surprising, because the aluminum within layer 1121 may be expected to have an affinity for silicon dioxide diffusion blocking layer 1111, adjacent to which it is disposed, that is greater than its affinity for a platinum structure disposed at a spaced distance therefrom. Additionally, the aluminum within layer 1121 may be expected to diffuse within substrate 1110 in the absence of silicon dioxide diffusion blocking layer 1111 and platinum structure 1140. As such, it is surprising that the aluminum would concentrate at platinum structure 1140 rather than diffusing through substrate 1110 or remaining at silicon dioxide diffusion blocking layer 1111.

It is believed that the metal structures provided herein suitably may be used to form structures that otherwise may be difficult to form. For example, metal layer 421 and metal film 431 illustrated in FIG. 4C, or metal layer 521 and metal film 531 illustrated in FIG. 5C suitably may be used as capacitors in which the distance between the capacitor plates (that is, the between metal layer 421 and metal film 431 or between metal layer 521 and metal film 531) may be selected by adjusting the position of metal structure 440 or 540 relative to metal film 431 or 531, respectively.

Figure 12A:
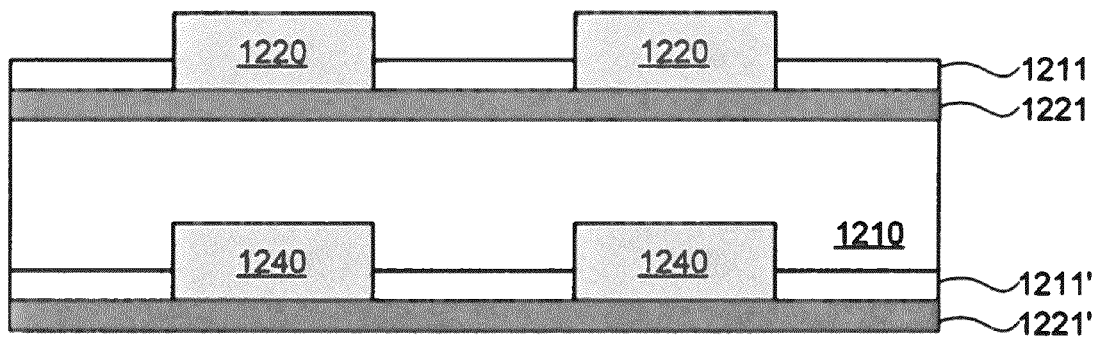
FIGS. 12A-12C schematically illustrate cross-sectional views an alternative exemplary metal structure that may be used to transport contamination in a semiconductor substrate having electronic circuitry thereon, according to some embodiments of the present invention.
Figure 12B:
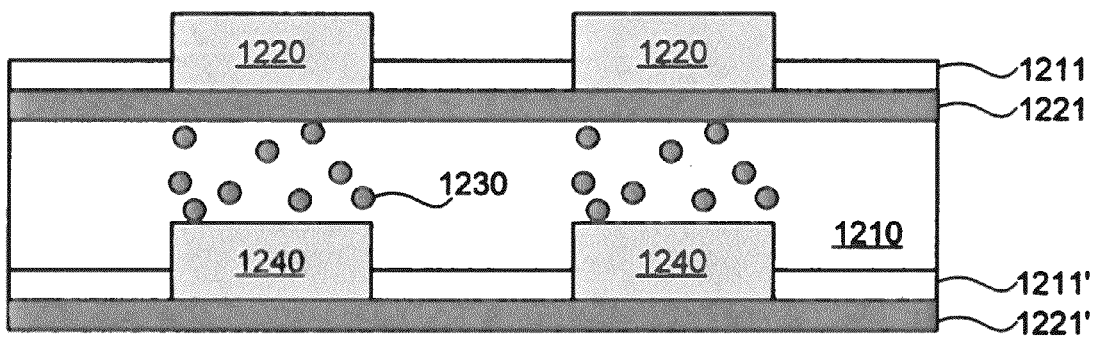
Figure 12C:
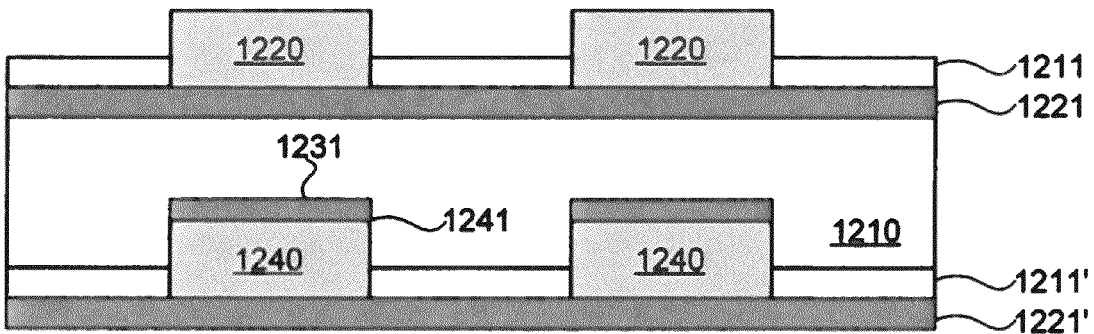

FIGS. 12A-12C illustrate another exemplary device that may be formed using the present metal structures. Specifically, FIG. 12A illustrates a precursor device that includes a relatively thin semiconductor (e.g., silicon) substrate 1210. A first metal layer 1221 is disposed on the upper surface of substrate 1210, upon which a first set of interconnects or electrodes 1220 and a first electrically insulating layer 1211 are disposed. Preferably, interconnects or electrodes 1220 are in electrical communication with first metal layer 1221 through apertures within first electrically insulating layer 1211. A second electrically insulating layer 1211' is disposed on the lower surface of substrate 1210, upon which a second metal layer 1221' is disposed. Interconnects or electrodes 1240 are disposed within substrate 1210 and preferably are in electrical communication with second metal layer 1221' through apertures within second electrically insulating layer 1211'. Preferably, interconnects or electrodes 1240 are formed of a different metal than is first metal layer 1221. As illustrated in FIG. 12B, interconnects or electrodes 1240 transport metal 1230 from first metal layer 1221; as illustrated in FIG. 12C, interconnects or electrodes 1240 concentrate the transported metal to form films 1231 disposed thereat. Accordingly, interconnects electrodes 1240 not only may perform an electrical function within substrate 1210, but also may transport materials such as metal 1230 within substrate 1210. In some embodiments, resulting metal film 1231 may perform a electrical function within substrate 1210. In other embodiments, metal 1230 may represent contamination within substrate 1210, and electrodes 1240 may getter that contamination. The arrangement of components illustrated in FIG. 12C, when suitably modified to include appropriate materials or electronic circuitry, may be used as a solar cell or other electronic device.

Although various embodiments of the invention are described herein, it will be evident to one skilled in the art that various changes and modifications may be made without departing from the invention. It is intended in the appended claims to cover all such changes and modifications that fall within the true spirit and scope of the invention.

What is claimed is:

1. A structure for transporting a first metal disposed on or within a semiconductor substrate, the structure comprising:
   a first layer comprising the first metal disposed on or within the semiconductor substrate; and
   a second layer comprising a second metal disposed within the semiconductor substrate and at a spaced distance from the first layer,
   the second metal being configured to transport the first metal thereto through the semiconductor substrate and to concentrate the first metal at the second layer such that the first metal forms a third layer disposed on the second layer.

2. The structure of claim 1, wherein the semiconductor substrate comprises silicon, the second metal comprises platinum, and the first metal comprises H, Al, Ca, Cu, Fe, or Na.

3. The structure of claim 1, wherein the second metal comprises Al, Au, Ag, Ca, Cu, K, Li, Mn, Na, Pt, or Rb.

4. The structure of claim 1, wherein the first metal comprises H, Al, Au, Ag, Ca, Cu, K, Li, Mn, Na, Pt, or Rb.

5. The structure of claim 1, wherein the substrate has an aperture defined in an upper surface thereof, and wherein the second layer is disposed within the aperture.

6. A structure for transporting a material disposed on or within a semiconductor substrate, the structure comprising:
   a first layer comprising the material disposed on or within the semiconductor substrate; and
   a second layer comprising metal disposed within the semiconductor substrate and at a spaced distance from the first layer,
   the second layer being configured to transport the material thereto through the semiconductor substrate and to concentrate the material at the second layer such that the material forms a third layer disposed on the second layer,
   wherein the second layer is disposed within the substrate using ion implantation.

7. The structure of claim 1, wherein the first metal is disposed within the substrate using ion implantation.

8. A method for transporting a first metal disposed on or within a semiconductor substrate, the method comprising:
   disposing a first layer comprising the first metal disposed on or within the semiconductor substrate;
   disposing a second layer comprising a second metal within the semiconductor substrate and at a spaced distance from the first layer;
   transporting the first metal through the semiconductor substrate with the second layer; and
   concentrating the first metal at the second layer such that the first metal forms a third layer disposed on the second layer.

9. The method of claim 8, wherein the semiconductor substrate comprises silicon, the second metal comprises platinum, and the first metal comprises Al, Ca, Cu, Fe, or Na.

10. The method of claim 8, wherein the second metal comprises Al, Au, Ag, Ca, Cu, K, Li, Mn, Na, Pt, or Rb.

11. The method of claim 8, wherein the first metal comprises Al, Au, Ag, Ca, Cu, K, Li, Mn, Na, Pt, or Rb.

12. The method of claim 8, wherein disposing the second layer within the semiconductor substrate comprises defining an aperture in an upper surface of the substrate and disposing the second layer within the aperture.

13. A method for transporting a material disposed on or within a semiconductor substrate, the method comprising:
   disposing a first layer comprising the material disposed on or within the semiconductor substrate;
   disposing a second layer comprising a second metal within the semiconductor substrate and at a spaced distance from the first layer;
   transporting the material through the semiconductor substrate with the second layer; and
   concentrating the material at the second layer,
   wherein disposing the second layer within the semiconductor substrate comprises implanting ions of the second metal into the substrate.

14. The method of claim 8, wherein the first metal is disposed within the substrate using ion implantation.

15. The method of claim 8, wherein the second layer is entirely embedded within the semiconductor substrate.

16. The method of claim 8, wherein the first metal concentrates at an interface between the second layer and the semiconductor substrate.

17. The structure of claim 1, wherein the second layer is entirely embedded within the semiconductor substrate.

18. The structure of claim 1, wherein the first metal concentrates at an interface between the second layer and the semiconductor substrate.

19. The structure of claim 1, wherein the first metal is different than the second metal.

20. The method of claim 8, wherein the first metal is different than the second metal.

* * * * *